(12) United States Patent
Graber et al.

(10) Patent No.: US 11,424,084 B2
(45) Date of Patent: Aug. 23, 2022

(54) ELECTRICAL CONTACT GEOMETRY FOR SWITCHGEAR

(71) Applicant: Georgia Tech Research Corporation, Atlanta, GA (US)

(72) Inventors: Lukas Graber, Atlanta, GA (US); Tushar Damle, Atlanta, GA (US); Gyu Cheol Lim, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 16/756,411

(22) PCT Filed: Oct. 19, 2018

(86) PCT No.: PCT/US2018/056743
§ 371 (c)(1),
(2) Date: Apr. 15, 2020

(87) PCT Pub. No.: WO2019/079740
PCT Pub. Date: Apr. 25, 2019

(65) Prior Publication Data
US 2020/0321167 A1 Oct. 8, 2020

Related U.S. Application Data

(60) Provisional application No. 62/574,985, filed on Oct. 20, 2017.

(51) Int. Cl.
*H01H 1/06* (2006.01)
*G01R 31/327* (2006.01)
(Continued)

(52) U.S. Cl.
CPC .......... *H01H 1/06* (2013.01); *G01R 31/3277* (2013.01); *H01H 1/14* (2013.01); *H01H 1/58* (2013.01);
(Continued)

(58) Field of Classification Search
CPC .......... H01H 2007/64; H01H 2203/00; H01H 2203/038; H01H 2203/05;
(Continued)

(56) References Cited

U.S. PATENT DOCUMENTS

| | | |
|---|---|---|
| 2008/0003894 A1 | 1/2008 | Hall et al. |
| 2008/0277258 A1 | 11/2008 | Foster et al. |
| 2012/0048736 A1* | 3/2012 | Nowodzinski ....... H01H 1/0036 204/643 |

FOREIGN PATENT DOCUMENTS

WO     2009/042306     4/2009

OTHER PUBLICATIONS

Search Report and Written Opinion from PCT Application No. PCT/US18/056743 dated Oct. 19, 2018 (16 pages).

* cited by examiner

*Primary Examiner* — Anthony R Jimenez
(74) *Attorney, Agent, or Firm* — Troutman Pepper Hamilton Sanders LLP; Ryan A. Schneider

(57) ABSTRACT

Systems, devices, and methods disclosed herein can generally include electrical contacts for high voltage, high current, and/or fast acting electromechanical switches and methods for manufacturing the same. The electrical contacts can be optimized for high voltage blocking capabilities with minimal gap spacing in the open state and low electrical resistance when in contact in the closed state. Electrical contacts can have a geometry to produce a low peak electric field between the contacts when in the open state, have a high contact surface area when in the closed state, and a low mass. The geometry of the contacts can be based on geometries traditionally utilized for uniform field electrodes.

20 Claims, 8 Drawing Sheets

(51) Int. Cl.
  *H01H 1/14*     (2006.01)
  *H01H 1/58*     (2006.01)
  *H01H 9/54*     (2006.01)
  *H01H 57/00*    (2006.01)
  *H01H 11/04*    (2006.01)
(52) U.S. Cl.
  CPC ............ *H01H 9/548* (2013.01); *H01H 11/04* (2013.01); *H01H 57/00* (2013.01)
(58) Field of Classification Search
  CPC ......... H01H 2203/058; H01H 2227/00; H01H 2227/018; H01H 2227/022; H01H 2227/026; H01H 13/00; H01H 13/78; H01H 13/785; H01H 13/79; H01H 13/80; H01H 13/807; H01H 2001/00; H01H 2001/02; H01H 2001/12; H01H 2001/14; H01H 1/06; H01H 1/12; H01H 1/14; H01H 1/58; H01H 1/00; H01H 1/0036; H01H 1/0094; H01H 11/00; H01H 11/04; H01H 2203/002; H01H 2203/004; H01H 2203/042; H01H 2203/04; H01H 2205/00; H01H 2205/016; H01H 2205/018; H01H 2201/00; H01H 2201/008; H01H 2201/022; H01H 2011/00; H01H 2011/04; H01H 13/50; H01H 9/54; H01H 57/00; H01B 5/00; G01R 31/327
  See application file for complete search history.

Normalized Electric Field

ELECTRICAL CONTACT GEOMETRY FOR SWITCHGEAR

CROSS-REFERENCE TO RELATED APPLICATIONS

This Application claims priority to U.S. Provisional Patent Application No. 62/574,985 field Oct. 20, 2017 titled "Electrical Contact Geometry for Switchgear Applications."

STATEMENT REGARDING FEDERALLY SPONSORED RESEARCH OR DEVELOPMENT

This invention was made with Government support under Grant Number 2166DDH awarded by the National Science Foundation. The Government has certain rights in the invention.

THE NAMES OF THE PARTIES TO A JOINT RESEARCH AGREEMENT

Not Applicable

SEQUENCE LISTING

Not Applicable

STATEMENT REGARDING PRIOR DISCLOSURES BY THE INVENTOR OR A JOINT INVENTOR

Not Applicable

BACKGROUND OF THE INVENTION

1. Field of the Invention

This disclosure relates generally to electrical switches, and more particularly to electrical contacts for electromechanical switches.

2. Description of Related Art

Electrical switches come in many varieties to suite a plethora of applications. In general, electrical switches serve the function of opening an electrical circuit to interrupt electrical current flow or closing an electrical circuit to allow electrical current to flow. Most electrical switches in use today fall into two broad categories: electromechanical switches and semiconductor switches.

Electromechanical switches have electrically conductive contacts movable between an open position and a closed position. In the closed position, the contacts touch each other, allowing current to flow from one contact to the other. In the open position, the contacts are separated from each other by an insulating gap (e.g., air, oil, or vacuum), preventing electrical current from flowing from one contact to the other. Electromechanical switches therefore have a mechanical component for physically moving the contacts from the open position to the closed position and vice versa. Semiconductor switches are purely electrical and function by manipulating electrical properties of a portion of the semiconductor switch (e.g., a channel) to either allow electrical current to flow through the semiconductor or block electrical current from flowing through the semiconductor.

Because electromechanical switches have a moving component, they are typically much larger, and change between open and closed states much slower, compared to semiconductor switches which are purely electrical. For this reason, semiconductor switches are typically utilized in applications where small size and/or high speed is desired (e.g., microprocessors, battery charging circuits, power converters, etc.), and electromechanical switches are relegated to applications where either mechanical operation is desired (e.g., light switches, push buttons, etc.), where semiconductor switches are unable to function (e.g., high voltage and/or current power distribution applications) or where semiconductor switches are too expensive for the application (e.g., on/off relays in alternating current circuits).

In general, and for the last several decades, significant focus has been dedicated to advancing semiconductor technology, and as a result, applications where electromechanical switches are utilized has progressively declined. While, since at least the 1970's semiconductor technology has advanced following "Moore's law," there is no such Moore's law equivalent in advancement of electromechanical switches. However, even after over 40 years of following the Moore's law trajectory, electromechanical switches persist in certain applications. Particularly in high voltage and/or high current applications, semiconductor devices inherently introduce significant electrical resistance into the circuit when in the closed state (leading to unwanted heat and power dissipation) and are susceptible to failure due to transient voltage spikes when in the open state (leading to catastrophic circuit failure and property damage). In applications where semiconductor switches cannot be utilized, electrical circuits therefore must be designed to tolerate the slow switching speed and bulk of electromechanical switches.

There is therefore a need for improved electrical switches for high voltage, high current applications, and/or high-speed switching applications.

BRIEF SUMMARY OF THE INVENTION

Systems, devices, and methods disclosed herein can generally include electrical contacts for electromechanical switches and methods for manufacturing the same. An object of the present disclosure is to provide electrical contacts that can be utilized in high voltage, high current, and/or fast acting electromechanical switches. The electrical contacts can be optimized for high voltage blocking capabilities with minimal gap spacing in the open state, low electrical resistance when in contact in the closed state, and/or reduced mass for faster transition between open and closed states. Electrical contacts can have a geometry to produce a low peak electric field between the contacts when in the open state, have a high contact surface area when in the closed state, and/or have reduced height to result in lower mass contacts. The geometry of the contacts can be based on geometries traditionally utilized for uniform field electrodes.

In some embodiments, a method can include selecting a geometrical shape for a pair of contact surfaces of a pair of electrical contacts, the geometrical shape having a perimeter and a surface defined by one or more variables; and selecting a value for each of the variables based on an electric field between the pair of electrical contacts when the pair of electrical contacts are in an open position.

The perimeter of the surface can be circular. The surface of the geometrical shape can be radially symmetrical and have a profile defined by the radius of the perimeter and the one or more variables. The profile can be a uniform field profile such as a Rogowski profile, a Bruce profile, a Chang profile, an Ernst profile, a Harrison profile, or a Borda profile. For the Rogowski profile, the surface of the geometrical shape can be defined by a line of force variable $\phi$. For the Bruce profile, the surface of the geometrical shape can be defined by a characteristic angle of a sinusoidal section $\alpha$. Alternatively, the profile can be an elliptical profile, and the height of the elliptical profile can be a variable that defines the surface of the geometrical shape.

The perimeter of the surface can be circular and have a radius measuring between about 2 mm and about 10 mm, and within this range of radii, for a given radially symmetrical profile, a value can be selected for a variable that defines the profile within a given range, depending on the profile. When the geometric shape has an elliptical profile, the method can include selecting a height of about 1 mm. When the geometric shape has a Rogowski profile, the method can include selecting a value of a line force variable between about −600 and about −480. When the geometric shape has a Bruce profile, the method can include selecting a value of characteristic angle of the sinusoidal section $\alpha$ between about 40° and about 70°.

The pair of electrical contacts can be contacts of an electromechanical switch, the contact surfaces can be positioned opposite each other, and the contact surfaces can be symmetric with respect to each other about a plane between the pair of contacts.

The method can further include selecting each value for each of the at least one variables to minimize a peak of the electric field between the pair of open contacts.

The method can further include selecting each value for the variables based at least in part on the electric field between the contacts in the open position and at least in part on a contact resistance between the contacts in a closed position.

The method can further include selecting each value for the variables based at least in part on the electric field between the contacts in the open position at least in part on a mass of at least one of the pair of electrical contacts.

The contact surfaces of the pair of electrical contacts can be separated by a gap measuring about 0.5 mm when the pair of electrical contacts are in the open position.

The method can further include moving the pair of electrical contacts from the open position to a closed position in response to a contact force of approximately 100 N.

The electric field can result from an electrostatic potential of about 15 kV between the pair of electrical contacts in the open position.

The pair of electrical contacts can be configured to conduct about 600 A when the pair of electrical contacts are in a closed position.

The method can further include providing the pair of electrical contacts; and positioning the pair of electrical contacts within an electromechanical switch such that the pair of electrical contacts are movable from the closed position to the open position. The method can further include positioning the electromechanical switch within a hybrid circuit breaker. The electromechanical switch can be an ultrafast disconnect switch (UFDS). The method can further include providing a vacuum within the hybrid circuit breaker; and positioning the pair of electrical contacts within the vacuum.

The method can further include selecting a piezoelectric actuator; connecting the piezoelectric actuator to at least one contact of the pair of electrical contacts; and positioning the piezoelectric actuator to move the at least one contact. The method can further include positioning the piezoelectric actuator to provide a gap measuring about 0.5 mm between the pair of electrical contacts when the pair of electrical contacts are in the open position. The method can further include moving the pair of electrical contacts from the closed position to the open position in response to a movement of the piezoelectric actuator. The method can further include applying a force, by the piezoelectric actuator, to the at least one contact to create a contact force between the pair of electrical contacts of about 100 N.

In some embodiments, a system can include an electrical contact having a contact surface with a circular perimeter and a uniform field profile that is radially symmetrically and extends from the perimeter. The electrical contact can be usable with another electrical contact to form a pair of electrical contacts, such that the contact surfaces of the pair of contacts are configured to contact each other.

The uniform field profile of the electrical contact can be a Rogowski profile, a Bruce profile, a Chang profile, an Ernst profile, a Harrison profile, or a Borda profile. A Rogowski profile can be defined at least in part by a radius of the circular perimeter and a line force variable $\phi$. The uniform field profile can be a Rogowski profile having a radius of between about 2 mm and about 10 mm and a line force variable between about −600 and about −480. A Bruce profile can be defined at least in part by the radius of the circular perimeter and a characteristic angle of a sinusoidal section $\alpha$. The uniform field profile can be a Bruce profile having a radius of between about 2 mm and about 10 mm and a characteristic angle of the sinusoidal section $\alpha$ measuring between about 40° and about 70°.

The system can include the second electrical contact. The second contact surface can be positioned opposite the first contact surface and can be shaped as a mirror image of the first contact surface. The first and second contact surfaces of the first and second contacts can be configured to contact each other in a closed position and be separated by a gap in an open position.

The gap can measure about 0.5 mm. The first and second electrical contacts can be configured to with withstand about 15 kV in the open position when separated by the 0.5 mm gap.

The first and second electrical contacts can be configured to remain in the close position in response to a contact force of about 100 N.

The first and second electrical contacts can be configured to conduct about 600 A in the closed position.

The system can include an electromechanical switch comprising the first and second electrical contacts.

The system can include a piezoelectric actuator configured to transition the first and second electrical contacts from a closed position to an open position. The piezoelectric actuator can be configured to apply a contact force of about 100 N.

The system can include a hybrid circuit breaker that utilizes the electromechanical switch and the piezoelectric actuator, and the pair of electrical contacts operate in a vacuum.

These and other aspects of the present disclosure are described in the Detailed Description below and the accompanying figures. Other aspects and features of embodiments of the present disclosure will become apparent to those of ordinary skill in the art upon reviewing the following description of embodiments in concert with the figures. While features of the present disclosure may be discussed relative to certain embodiments and figures, all embodiments of the present disclosure can include one or more of the features discussed herein. Further, while one or more embodiments may be discussed as having certain advantageous features, one or more of such features may also be used with the various embodiments of the disclosure discussed herein. In similar fashion, while embodiments may be discussed below as device, system, or method embodiments, it is to be understood that such embodiments can be implemented in various devices, systems, and methods of the present disclosure.

BRIEF DESCRIPTION OF THE SEVERAL VIEWS OF THE DRAWINGS

The above and further aspects of this invention are further discussed with reference to the following description in conjunction with the accompanying drawings, in which like numerals indicate like structural elements and features in various figures. The drawings are not necessarily to scale, emphasis instead being placed upon illustrating principles of the invention. The figures depict one or more implementations of the inventive devices, by way of example only, not by way of limitation.

DETAILED DESCRIPTION OF THE INVENTION

Figures 1A, 1B:
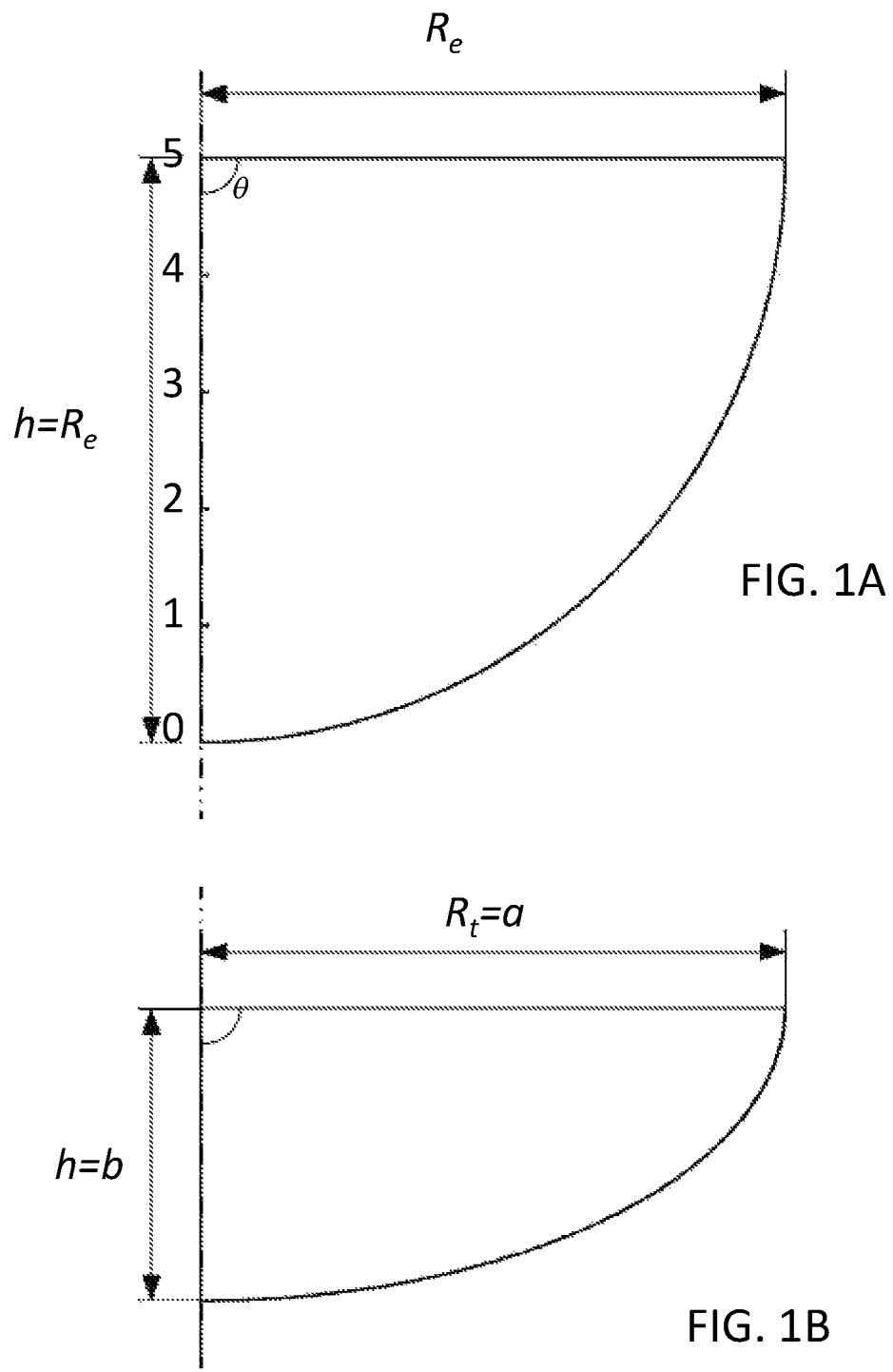
FIGS. 1A to 1D illustrate mathematical geometry of cylindrically symmetrical contacts having a spherical, elliptical, Rogowski, and Bruce shape respectively, according to the present invention.

The components, steps, and materials disclosed hereinafter as making up various elements of the disclosed technology are intended to be illustrative and not restrictive. Many suitable components, steps, and materials that would perform the same or similar functions as the components, steps, and materials disclosed herein are intended to be embraced within the scope of the disclosed technology. Such other components, steps, and materials not disclosed herein can include, but are not limited to, similar components or steps that are developed after development of the disclosed technology.

The embodiments disclosed herein illustrate electrical contacts for electromechanical switches, applications of said contacts, and methods for designing or manufacturing said contacts.

An object of the present invention is to minimize local electric field enhancement between contact surfaces of electromechanical switches. To that end, electrical contacts having a variety of surface geometries are disclosed herein. Local electric field enhancement can also be minimized if electrical contacts are made of materials with high critical breakdown field and have smooth contact surfaces.

It is also an object of the present invention to provide electrical contacts for an improved hybrid circuit breaker and for other applications requiring an electromechanical switch having a small gap between open contacts and/or fast disconnect speeds.

Analysis of simulated electric field profiles, calculated maximum electric field, calculated mass of the contacts, and analysis of empirically calculated and simulated resistance between closed contacts are presented for several example geometries of contacts according to embodiments disclosed herein. Principles disclosed herein can be applied to various applications, and specific examples are not intended to limit the scope of what is claimed.

Comparative analysis on electric field and resistance is presented for different contact geometries: spherical, elliptical, Rogowski, and Bruce. Prior to this work, hybrid circuit breakers have primarily been developed with spherical-shaped contacts, and although various contact geometries are used in other applications, known contact shapes are not optimized according principals disclosed herein.

Each studied contact shape has a circular perimeter and a radially symmetrical surface extending from the circular perimeter. The circular perimeter can be defined by a radius, and the radially symmetrical surface can be defined by a cross-sectional profile. While the shape of a contact having a spherical profile is, by definition, determined by the radius of the contact shapes having an elliptical, Rogowski, or Bruce profile each have at least one variable in addition to the radius that can be selected to optimize the shape for use as an electrical contact. The spherical shape is therefore presented as a baseline for comparison for optimizing elliptical, Rogowski, and Bruce shapes. As will be appreciated and understood by one of ordinary skill in the art, a number of shapes could be optimized for use as electrical contacts according to the principles disclosed herein.

Rogowski and Bruce profiles are found primarily in laboratory environments in the application of generating substantially uniform electric fields between permanently separated electrodes when such is required for laboratory experiments. Electrodes having Rogowski, Bruce, and other uniform field profiles are typically optimized for creating uniform electric fields, and therefore known uniform field profiles are not optimized for electrical contacts requiring a reduced a peak electric field, a low contact resistance, and/or low moving mass. It is contemplated that other uniform field profiles including but not limited to Chang, Ernst, Harrison, and Borda could be optimized for use as electrical contacts according to the principles disclosed herein.

In some embodiments, electric field distribution for contact separation of 0.5 mm is modeled with finite element analysis to compare the peak electric field between pairs of contacts having the spherical, elliptical, Rogowski, and Bruce profiles. The choice of 0.5 mm contact separation is based on the design of an existing disconnect switch. In some embodiments presented herein, contact diameter was also varied over a range of 2 mm to 10 mm. It will be appreciated and understood by one of ordinary skill in the art that specific design choices such as contact separation and contact diameter can be selected based on the design criteria of a particular electromechanical switch, and example embodiments presented herein are not intended to include every possible design contemplated.

In some embodiments, electric resistance between a number of contact pairs is analyzed and compared. Tradeoffs can exist between minimizing electric field enhancement and minimizing contact resistance. In some embodiments, both electric resistance and peak electric field can be minimized to within an acceptable range for a given design application to thereby optimize the shape of a contact surface for the given design application.

In some embodiments, heights of contact geometries are compared, and in some embodiments volume of contact geometries are compared to compare relative mass of contacts having differing contact geometries. Tradeoffs can exist between minimizing electric field enhancement and minimizing contact mass. In some embodiments, both mass and peak electric field can be minimized to within an acceptable range for a given design application to thereby optimize the shape of a contact surface for the given design application.

Turning to the Figures, as illustrated in FIG. 1A, a spherical profile can be modeled by rotating a quarter of a circle, $-\pi/2 \leq \theta \leq 0$ with the center as the rotation of axis.

$$\begin{cases} x_S = R_e \cdot \cos\theta + x_\omega & \text{(Equation 1-1)} \\ y_S = R_e \cdot \sin\theta + y_\omega & \text{(Equation 1-2)} \end{cases}$$

Spherical profiles are defined by only one variable, the radius $R_e$. The height is subsequently equal to the value of the radius. Here $x_\omega$ and $y_\omega$ define the center coordinate of spherical contact.

As illustrated in FIG. 1B, to have more design variables for the contact geometry, elliptical profiles are considered. Elliptical profiles have two variables, a and b which determine the radius and the height respectively. The contact is modeled by rotating a quarter of the ellipse, $-\pi/2 \leq \theta \leq 0$.

$$\begin{cases} x_E = a \cdot \cos\theta + x_\omega & \text{(Equation 2-1)} \\ y_E = b \cdot \sin\theta + y_\omega & \text{(Equation 1-2)} \end{cases}$$

An advantage of the elliptical profile over the spherical profile is the ability to adjust the height of the contact since the height is a parameter independent of the radius. An elliptical contact having a height less than the radius can therefore have reduced mass and contact resistance compared to a spherical contact of the same radius.

Figure 1C:
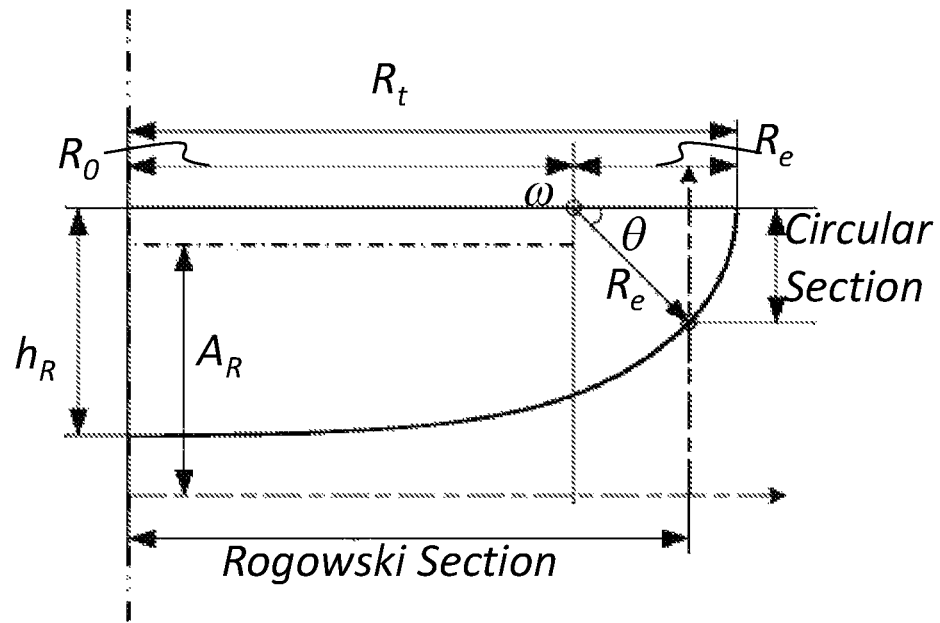

As illustrated in FIG. 1C, the Rogowski electrode profile can defined by two different sections: the exponential (or: Rogowski) section and the circular section. The Rogowski profile depicted in FIG. 1C and the related equations included herein are adapted from a publication by W. Rogowski in *Archiv für Electrotechnik* vol. 12 no. 1 in 1923.

In embodiments presented herein, the exponential section and a partial circular section are adopted. Starting from the exponential Rogowski curve, the shape continues as a circular curve until its slope becomes vertical at the edge of the contact.

The Rogowski section of the profile can be defined as follows:

$$\begin{cases} x_R = \frac{A_R}{\pi}(\phi + e^\phi \cos\Psi) & \text{(Equation 3-1)} \\ y_R = \frac{A_R}{\pi}(\Psi + e^\phi \sin\Psi) & \text{(Equation 3-2)} \end{cases}$$

where $\psi$ is the equipotential surface, $\phi$ is the line of force, and $A_R$ is the characteristic distance separating the plane electrode from the infinite ground plane. For modeling the contact, the parameter $A_R$ can be determined based on the radius of contact $R_t$, $\psi$, and $\phi$.

$$A_R = \frac{\pi \cdot R_t}{\frac{1 + \cos\Psi}{\sin\Psi}\sqrt{2(1 + \cos\Psi)}(|\phi_{min}| + e^{\phi_{max}}\cos\Psi - 1)} \quad \text{(Equation 4)}$$

The transition between the Rogowski and the circular section is taken at $\phi = 0$. The circular section can be defined as follows:

$$\begin{cases} x_c = R_e \cdot \cos\theta + x_\omega & \text{(Equation 5-1)} \\ y_c = R_e \cdot \sin\theta + y_\omega & \text{(Equation 5-2)} \end{cases}$$

where the center coordinate of the circular section is at $(x_\omega, y_\omega)$. To assure a smooth transition between the Rogowski and the circular sections of the contact, the coordinate of the center can be defined as follows.

$$x_\omega = -\frac{A_R}{\pi} \quad \text{(Equation 6-1)}$$

$$y_\omega = \frac{A_R}{\pi}\left[\frac{(1 + \cos\Psi)^2}{\sin\Psi} + \sin\Psi + \Psi\right] \quad \text{(Equation 6-2)}$$

Along with the center coordinate, a point defining the start the circular section from the Rogowski section can be defined. The transition coordinate happens at $(0, y_o)$, where $y_o$ can be defined as follows.

$$y_o = \frac{A_R}{\pi}(\Psi + \sin\Psi) \quad \text{(Equation 7)}$$

As explained above, the end point of the circular section is at the location where the slope becomes vertical. From the starting point of the circular section to the last position, the angle is defined as $\theta = \beta$ and the range of $\theta$ is $0 \leq \theta \leq \beta$ where, $\beta$, the angle between, can be defined as follows.

$$\beta = -\sin^{-1}\left(\frac{y_\omega - y_o}{R_e}\right) \quad \text{(Equation 8)}$$

The total radius of the Rogowski contact is the sum of the corresponding radius of the circular section and the Rogowski section:

$$R_t = R_e + R_o \quad \text{(Equation 9)}$$

where $$R_e = \frac{A_R}{\pi} \cdot \frac{1 + \cos\Psi}{\sin\Psi}\sqrt{2(1 + \cos\Psi)} \quad \text{(Equation 10-1)}$$

$$R_o = \frac{A_R}{\pi} \cdot (\phi_{min} + e^{\phi_{min}}\cos\Psi - 1) \quad \text{(Equation 10-2)}$$

and where the conventional Rogowski profile corresponds to the equipotential surface of $\psi = \pi/2$. Using the conventional Rogowski profile, $\psi$ can be considered a predetermined value, and the Rogowski profile can defined by the parameters of radius, $R_t$, and line of force, $\phi$. It is contemplated that $\psi$ can be a value other than $\pi/2$ and can therefore act as an additional variable to further optimize a Rogowski shape for use as an electrical contact. For Rogowski-shaped contacts, the value of $\phi$ determines the curvature of the contact, which contributes to the height. To achieve a flat contact, $|\phi|$ can be big enough to avoid creating a protrusion at the center of the contact; such a protrusion is undesired because it could enhance the electric field between open contacts and increase the contact resistance between closed contacts. Since Rogowski curve is an exponential function, the slope converges to 0 as $|\phi|$ increases. The minimum $|\phi|$ value is when the slope of the Rogowski curve approaches near zero and the electric field enhancement between open contacts becomes negligible at the center. As $\phi$ approaches to negative infinity, the curve of the contact gets flatter, and the contact would become more like a cylindrical shape.

Figure 1D:
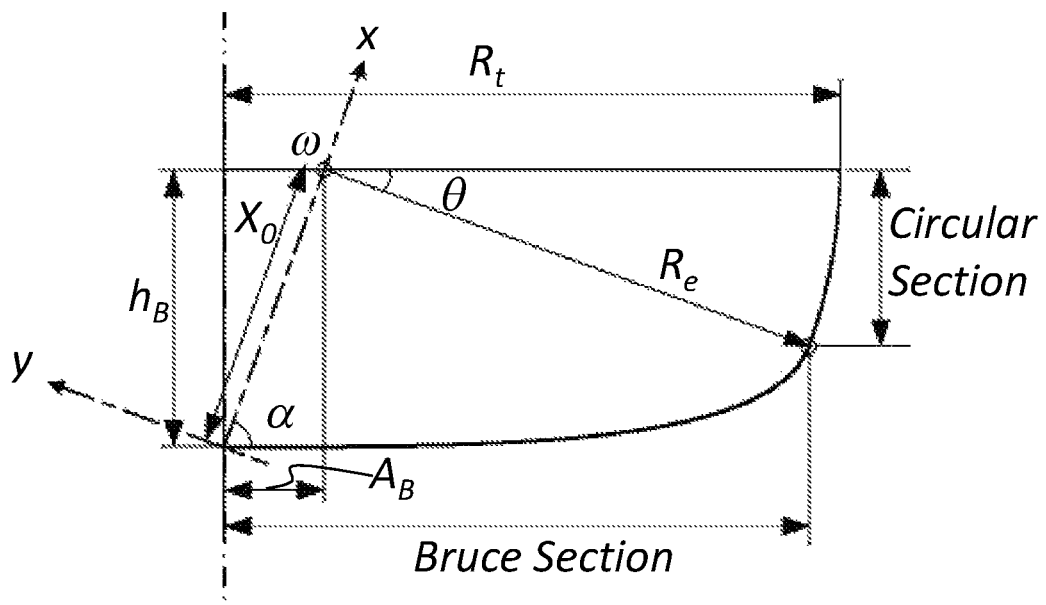

As illustrated in FIG. 1D, the Bruce shape can be defined by three different sections: plane, sinusoidal (Bruce), and circular sections. The Bruce profile depicted in FIG. 1D and the related equations included herein are adapted from a publication by F. M. Bruce in *Journal of IEE*, vol. 94 Part II in 1947.

In some embodiments, contacts having a Bruce profile are modeled with the plane section eliminated and only the sinusoidal section and a portion of the circular section are adopted. It is contemplated that the plane section could be introduced into the Bruce profile to add an additional variable that can be optimized for electrical contacts having a Bruce profile. In embodiments disclosed herein, starting from a sinusoidal curve, the curve of the Bruce profile converts to the circular curve until its slope becomes vertical. The Bruce section of the profile is defined as follows:

$$y_B = -R_e \sin\left(\frac{x}{X_o} \frac{\pi}{2}\right) \quad \text{(Equation 11)}$$

where $X_o$ is the distance of the circular section center co and $R_e$ is the radius of the circular section. $A_B$ is a radial distance beyond which the Bruce section extends before meeting the circular section. Here, $\alpha$ is the characteristic angle of the sinusoidal section:

$$X_o = \frac{A_B}{\cos\alpha} \quad \text{(Equation 12-1)}$$

$$R_e = \frac{2}{\pi} X_o \tan\alpha \quad \text{(Equation 12-2)}$$

$A_B$ can be determined by the variable of total radius, $R_t$ and angle, $\alpha$ as follows.

$$A_B = \frac{R_t}{\frac{2}{\pi} \cdot \frac{\tan\alpha}{\cos\alpha} + 1} \quad \text{(Equation 13)}$$

The circular section can be defined as follows:

$$\begin{cases} x_c = R_e \cdot \cos\theta + x_\omega \\ y_c = R_e \cdot \sin\theta + y_\omega \end{cases} \quad \text{(Equation 14-1)} \\ \text{(Equation 14-2)}$$

where the center coordinate of the circular section is at $(x_\omega, y_\omega)$ and $x_\omega$ and $y_\omega$ can be determined as follows.

$$x_\omega = X_o \quad \text{(Equation 15-1)}$$

$$y_\omega = 0 \quad \text{(Equation 15-2)}$$

Starting from the last point of the Bruce section, the angle of the circular section can be determined. The circular section can be defined to stop when the slope of the section becomes vertical. Therefore, the angle between the circular section $\beta$ can be determined by:

$$\beta = -\frac{\pi}{2} + \sin^{-1}\left(\frac{y_\omega^\alpha - y_o^\alpha}{R_e}\right) \quad \text{(Equation 16)}$$

where the rotating circular angle is $-\pi/2 \le \theta \le \beta$. The total radius of the Bruce profile can be defined as the sum of the corresponding radius of the circular section and the radial direction of the Bruce section as follows.

$$R_t = A_B + R_e \quad \text{(Equation 17)}$$

Bruce contacts have two variable parameters of radius $R_e$ and angle $\alpha$, the latter mainly determining the curvature of the contacts, which determines the height. The available range of $\alpha$ is from 0 to 90°. The curvature of the Bruce section therefore gets flatter as either $\alpha$ decreases or increases from the point of 55.5° in this example.

As illustrated in FIGS. 2A to 2D, the electric field in the test gap separation was modeled using a finite element model (FEM). In this simulation, the test gap for all contacts is set to be 0.5 mm. Varying both radius and design parameters for each contact geometry, the peak electric field is simulated within the gap. For the purposes of the simulation, the medium in the gap separation is considered vacuum, the bottom contact is grounded, and the potential of the top contact is at 1 V. As will be appreciated and understood by one of ordinary skill in the art, radius, gap separation, and contact voltage is design specific for a given application of the electrical contacts, and the simulation is not intended to capture all applications or any specific application. As will be appreciated and understood by one of ordinary skill in the art, switchgear will typically be designed to withstand an open circuit voltage several orders of magnitude greater than 1 V, and therefore the electric field analysis here is intended for comparative purposes only.

With the simulation so configured, this allows the electric field profile to be presented as a normalized the electric field expressed as a function of the geometry only, having a unit of [mm$^{-1}$]. Theoretically, a uniform electric field of a certain magnitude E is produced within the space limited between two parallel plane electrodes of infinite dimensions separated by a distance d and subjected to a potential difference of U by:

$$E = U/d \quad \text{(Equation 18)}$$

Contacts, however, do not have infinite dimensions, and as such, the electric field will be non-uniform between a pair of contacts. Electric fields between contacts can have an enhanced profile, or have areas of high electric field, at locations centrally between the contact surfaces or near or outside of edges of contact surfaces.

Considering a pair of contacts withstanding 1 V and separated by a 0.5 mm gap, a peak electric filed between the pair of contacts is expected to be greater than 2 mm$^{-1}$, where contacts having an optimized geometry have a peak electric field that approaches 2 mm$^{-1}$ within the 0.5 mm gap.

In FIGS. 2A to 2D, the normalized electric field between each pair of electrodes is shown divided into four regions of increasing electric field progressing from outside of region between the contacts toward the center of the contacts. A cross section of the pair of contacts at the center of each contact is illustrated.

Figure 2A:
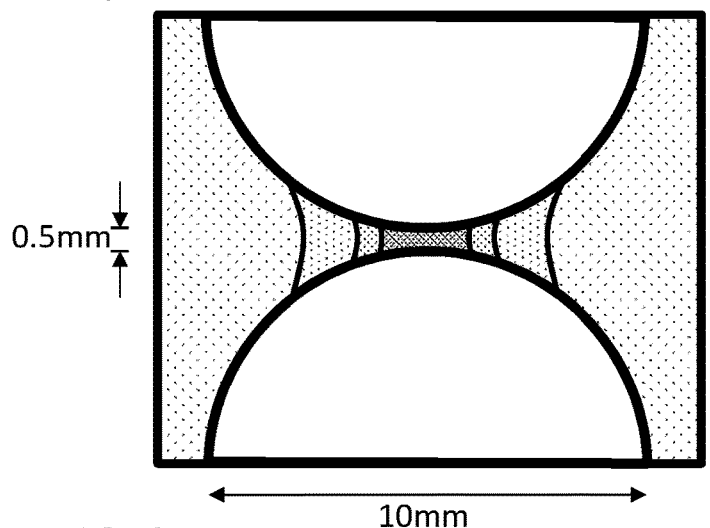
FIGS. 2A to 2D illustrate calculated electric field distribution between open contacts having a spherical, elliptical, Rogowski, and Bruce shape respectively, according to the present invention.
Figure 2A:
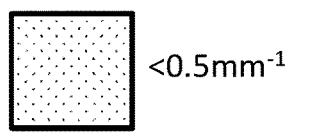
Figure 2A:
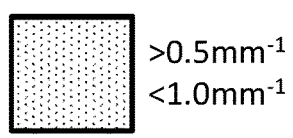
Figure 2A:
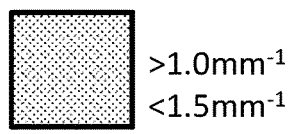
Figure 2A:
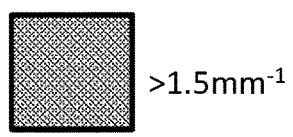
Figure 3A:
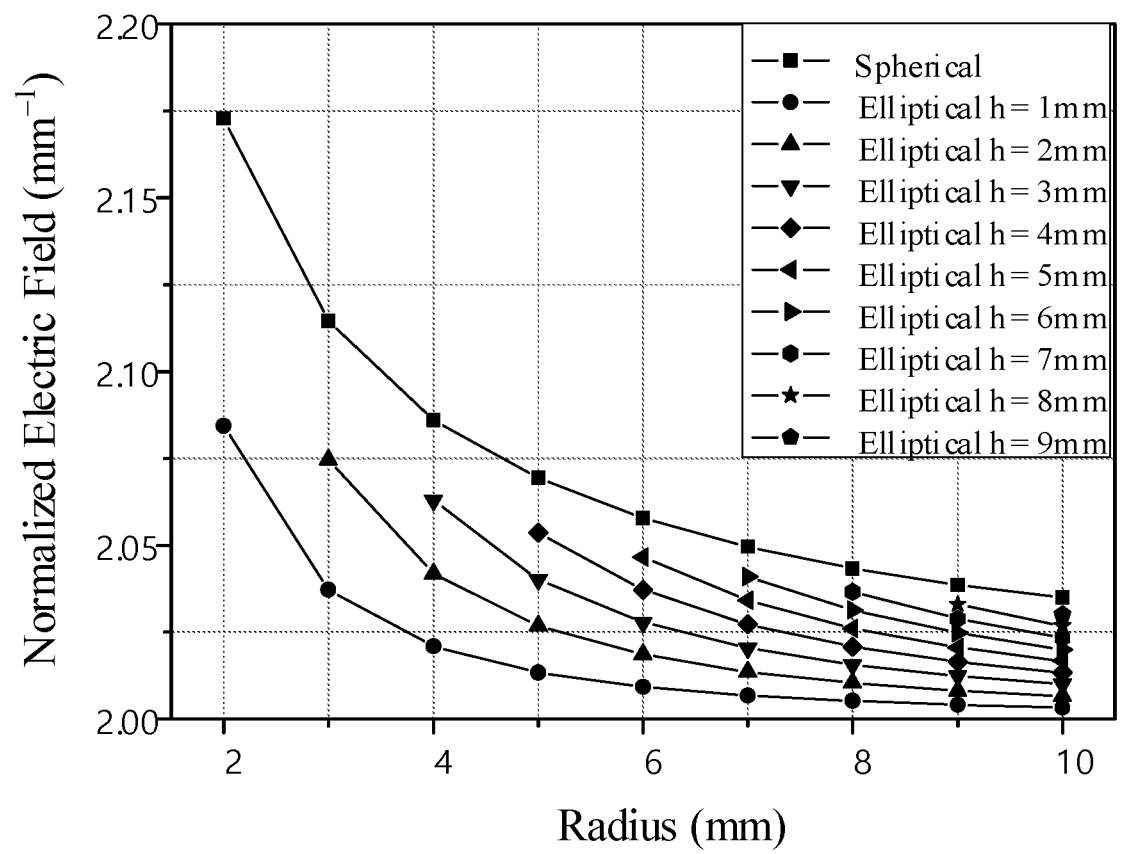
FIGS. 3A to 3C depict plots of simulated peak electric fields between open contacts having spherical and elliptical, Rogowski, and Bruce shape respectively, according to the present invention.

FIG. 2A illustrates the normalized electric field distribution of a 5 mm radius spherical contact. The peak electric field is located at the center of the contact, and it is simulated to be 2.075 mm$^{-1}$. For a radius of 2 mm to 10 mm, the peak electric field is simulated within the set gap separation and it is shown in FIG. 3A. As the radius of the contact becomes bigger, the reduction of peak electric field is observed.

Figure 2B:
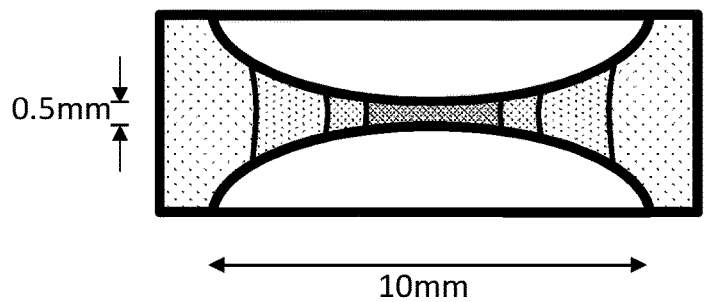

FIG. 2B illustrates the normalized electric field distribution of a 5 mm radius elliptical contact having a height of 2 mm. In FIG. 3A, the simulated peak electric field for the case of elliptical contacts having a radius of 2 mm to 10 mm, and heights of less than the corresponding radius is plotted. The comparison between spherical and elliptical contact is visually shown in FIG. 3A and it is noticeable that the peak electric field of elliptical contacts having heights less than their radius, as simulated, always lie below the field of spherical contact. Therefore, with a smaller height than that of the spherical contact, it is expected that the elliptical contacts can achieve a smaller peak electric field. The difference is more apparent when the radius and the height are small. Simulations indicate, for elliptical profiles having a radius between 2 mm and 10 mm, a contact height of about 1 mm can achieve a small peak electric field compared to elliptical contacts having smaller or larger heights. Simulations indicate, comparing a pair of contacts having a spherical shape and a radius of 2 mm to a pair of contacts having an elliptical shape, a radius of 2 mm, and a height of 1 mm, the peak electric field between the pair of contacts having the elliptical shape is about four times less than the peak electric field between the pair of contacts having the spherical shape. Simulations indicate, comparing a pair of contacts having a spherical shape and a radius of 10 mm to a pair of contacts having an elliptical shape, a radius of 10 mm, and a height of 1 mm, the peak electric field between the pair of contacts having the spherical shape is about 1.5 times that of the peak electric field between the pair of contacts having the elliptical shape. Therefore, for larger radii contacts, the difference in peak electric field between spherical-shaped compared to elliptical-shaped profiles is less pronounced, but the change in height is more significant, leading to significantly reduced contact mass for contacts having an elliptical shape.

Figure 2C:
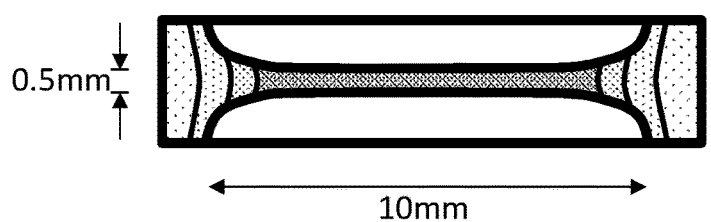
Figure 3B:
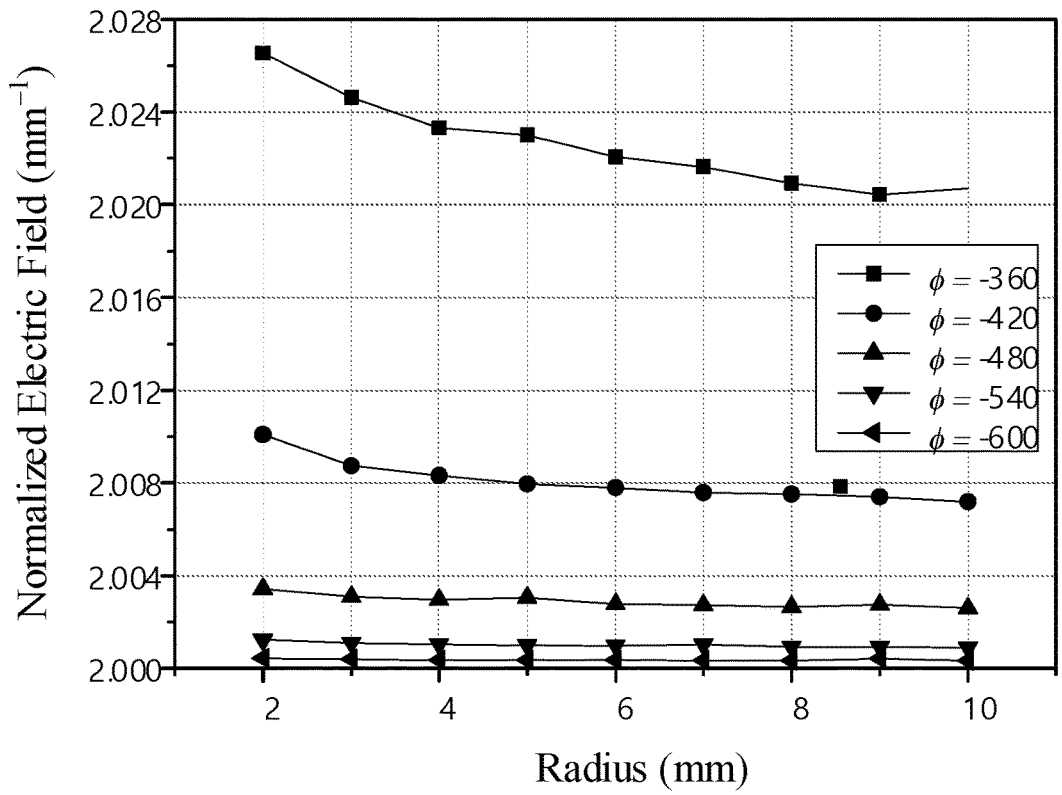

FIG. 2C illustrates the simulated electric field distribution model for Rogowski contacts with a radius of 5 mm and $\phi$ of −540. A more concentrated electric field distribution is observed compared to the spherical shape illustrated in FIG. 2A and the elliptical shape illustrated in FIG. 2B because the surface of the Rogowski shape is flatter than both the spherical contacts and elliptical contacts. As the value of $|\phi|$ increases, the Rogowski contact becomes flatter, and the height of contact also decreases. In this simulation, the dynamic change of the peak electric field $\phi$ is observed to be within −300 to −600. As shown in FIG. 3B, the peak electric field converges to 2 mm$^{-1}$ as $|\phi|$ increases and the difference among the electric field becomes smaller. The magnitude of the peak electric field between the simulated Rogowski-shaped contacts is significantly lower than the peak electric field as simulated between the spherical contacts.

Figure 2D:
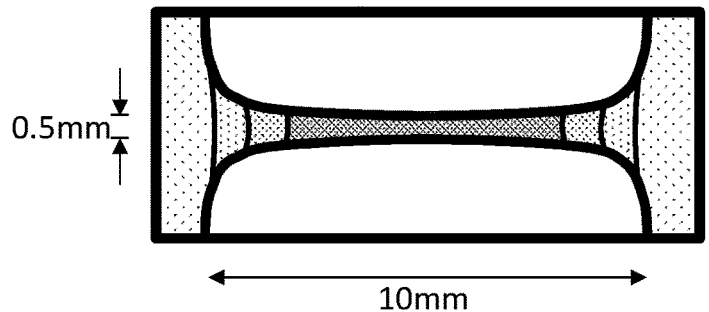
Figure 3C:
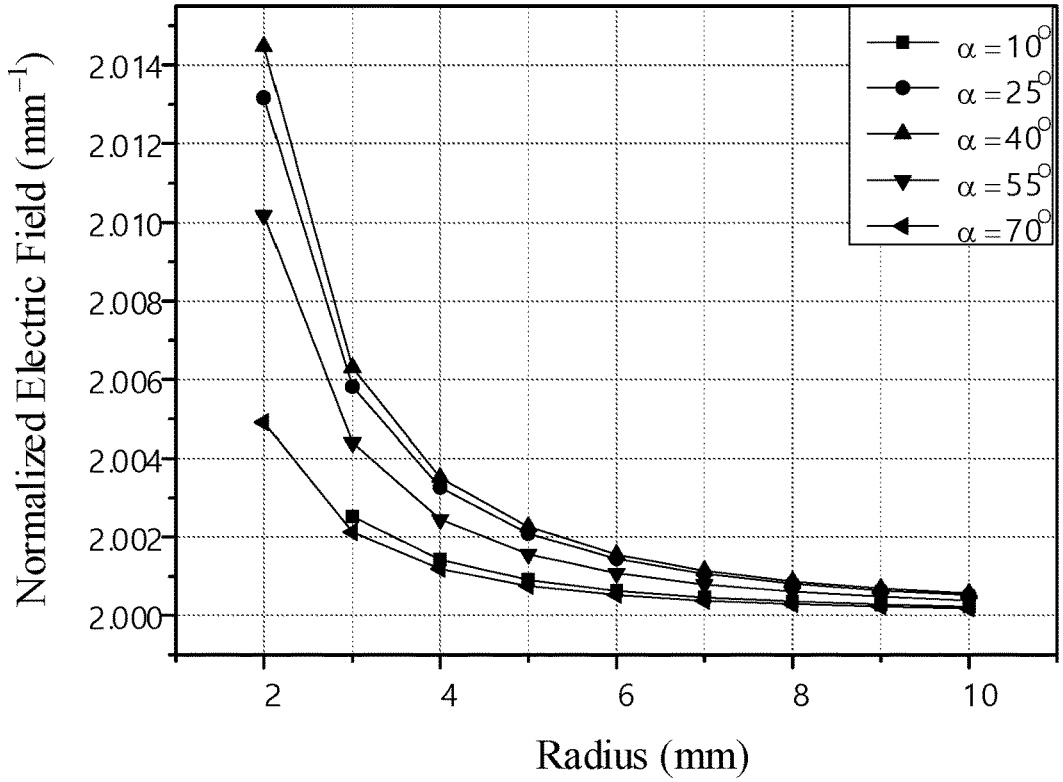

FIG. 2D illustrates the simulated electric field distribution model for Bruce-shaped contacts having a radius of 5 mm and α of 70°. The peak simulated electric field between pairs of Bruce-shaped contacts having a radius varying from 2 mm to 10 mm and various values of a is plotted in FIG. 3C. For contacts having a smaller radius, the results indicate a stronger relationship between the normalized peak electric field and α. The appearance of the plot is similar to that of spherical and elliptical contact (FIG. 3A). However, the magnitude of simulated electric field between the Bruce-shaped contacts of various geometries as plotted in FIG. 3D is smaller than the magnitude of the simulated electric field between the Rogowski-shaped contacts of various geometries as plotted in FIG. 3C.

The peak simulated electric field between pairs of Bruce-shaped contacts having a radius varying from 1 mm to 10 mm and various values of a is listed in Table 1.

TABLE 1

| $R_r/\alpha$ | 20° | 30° | 40° | 50° | 60° | 70° |
|---|---|---|---|---|---|---|
| 1 | 2.0221 | 2.0286 | 2.0291 | 2.0243 | 2.0171 | 2.0101 |
| 2 | 2.0055 | 2.007 | 2.007 | 2.0057 | 2.004 | 2.0024 |
| 3 | 2.0025 | 2.0032 | 2.0032 | 2.0026 | 2.0018 | 2.0011 |
| 4 | 2.0014 | 2.0018 | 2.0017 | 2.0014 | 2.001 | 2.0006 |
| 5 | 2.0009 | 2.0011 | 2.0011 | 2.0009 | 2.0006 | 2.0004 |
| 6 | 2.0006 | 2.0008 | 2.0008 | 2.0006 | 2.0004 | 2.0003 |
| 7 | 2.0004 | 2.0006 | 2.0006 | 2.0005 | 2.0003 | 2.0002 |
| 8 | 2.0003 | 2.0004 | 2.0004 | 2.0004 | 2.0002 | 2.0001 |
| 9 | 2.0003 | 2.0003 | 2.0003 | 2.0003 | 2.0002 | 2.0001 |
| 10 | 2.0002 | 2.0003 | 2.0003 | 2.0002 | 2.0002 | 2.0001 |

Contacts having a Bruce shape can be made significantly shorter than spherical contacts. Simulations indicate that Contacts having a Bruce shape in the ranges simulated above can be between 44% and 84% shorter than spherical contacts of the same radius. Another consideration with contacts having a Bruce shape is that as a is greater than or smaller than a given range, electric field enhancement can occur non-centrally between the contacts. In the simulations with a contact radius of 1 mm, peak electric fields were positioned centrally between Bruce-shaped contacts within a range of about 40°<α<60°. For simulations with increasing contact radius, peak electric fields occurred at the center of the contacts over a greater range of α.

Figure 4:
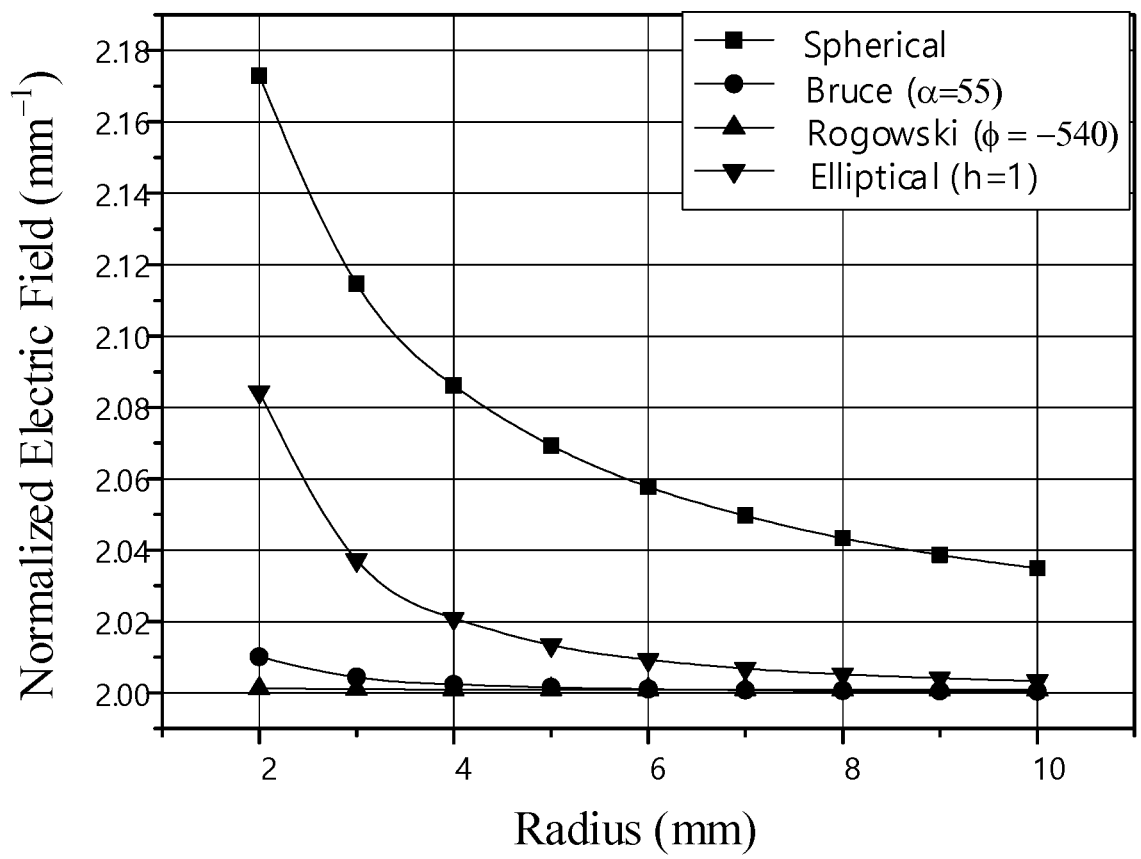
FIG. 4 depicts a plot of calculated peak electric fields between open contacts having a spherical, elliptical, Rogowski, and Bruce shape, according to the present invention.

The overall comparison of peak electric field among four different contact models is shown in FIG. 4. For the complete range of radius from 2 mm to 10 mm, contacts having either a Rogowski or a Bruce shape are simulated to have minimal peak electric field with values close to 2 mm$^{-1}$, an improvement over both the spherical and elliptical-shaped contacts. Spherical-shaped contacts, which are used as a basic comparative model, show a distinguishable difference of peak electric field compared to other models. Elliptical contacts have similar slope to spherical contact but a smaller peak value. The simulated peak electric field values for contacts of 5 mm radius are 2.06936 mm$^{-1}$, 2.01336 mm$^{-1}$, 2.00099 mm$^{-1}$, and 2.00156 mm$^{-1}$ for the spherical, elliptical (h=1 mm), Rogowski ($\phi$=−540), and Bruce (α=55°) respectively. Rogowski and Bruce contacts result in a 3.3% smaller peak electric field than the spherical contact. The greater the radius of the contacts, the smaller the difference of electric field between Rogowski and Bruce profiles. All the contact models indicate that the peak electric field decreases as the radius increases.

From the electric field analysis, the presented contact models other than spherical contact indicate that similar or lower peak electric field can be achieved with a reduced height of the contacts compared to that of spherical contacts. However, it is worth noting that typically, pairs of contacts having a reduced peak electric field have a larger surface area over which the electric field is relatively high (as illustrated in FIGS. 2A to 2D, for example). Contacts having relatively high electric fields over a larger surface area could therefore require greater surface uniformity to practically withstand open circuit voltages, could require narrower tolerances for manufacturing, and could require increase robustness to minimize deformation due to extended usage. In general, as contacts become flatter, electric field enhancement can occur at the edges of the contact. In some designs, some amount of electric field enhancement at contact edges can be acceptable, particularly if the peak electric field at the contact edges is less than a peak electric field at the center of the contacts.

Because electrical contacts function in both an open and a closed position, it is advantageous to not only consider the electric field between contacts in the open position, but also electrical resistance between the contacts when in the closed position.

The resistance of contacts in the closed position is simulated for contacts having various geometries. For the purposes of the study of the contact resistance, a fixed radius of 5 mm and a fixed height of the contact models are used. Copper is used as the material in modelling. Spherical contacts cannot vary the height with a fixed radius. The height is chosen to be same for elliptical, Rogowski, and Bruce profiles. Subsequently, the resistance of the contacts are compared with congruent contact radius and height. As will be appreciated and understood by one of ordinary skill in the art, contact resistance simulations presented herein are not intended to capture all applications, and the simulations are primarily presented as a means for comparison of various geometries. It is contemplated that a number of geometries not illustrated here could be compared with methodologies disclosed herein according to aspects of the present invention.

For the purposes of the simulations, the radius of all contact profiles is set to 5 mm. This is also the height of the spherical contact profile. For all other contact profiles, the height can be selected. In case of elliptical contact, a height of 1 mm is chosen. By fixing the height of the contact to 1 mm for Rogowski and Bruce contacts, the parameter of $\phi$ for Rogowski and $\alpha$ for Bruce was determined. For Rogowski contacts, the height is defined by:

$$h_R = \frac{A_R}{\pi}\sin\Psi\left(\cot^2\frac{\Psi}{2} + 1 + e^{\phi min}\right)$$ (Equation 19)

where $A_R$ is a function of radius and $\phi$.
For Bruce contacts, the height is defined by:

$$h_B = A_B \tan \alpha$$ (Equation 20)

where $A_B$ is a function of radius and $\alpha$.

Figure 5:
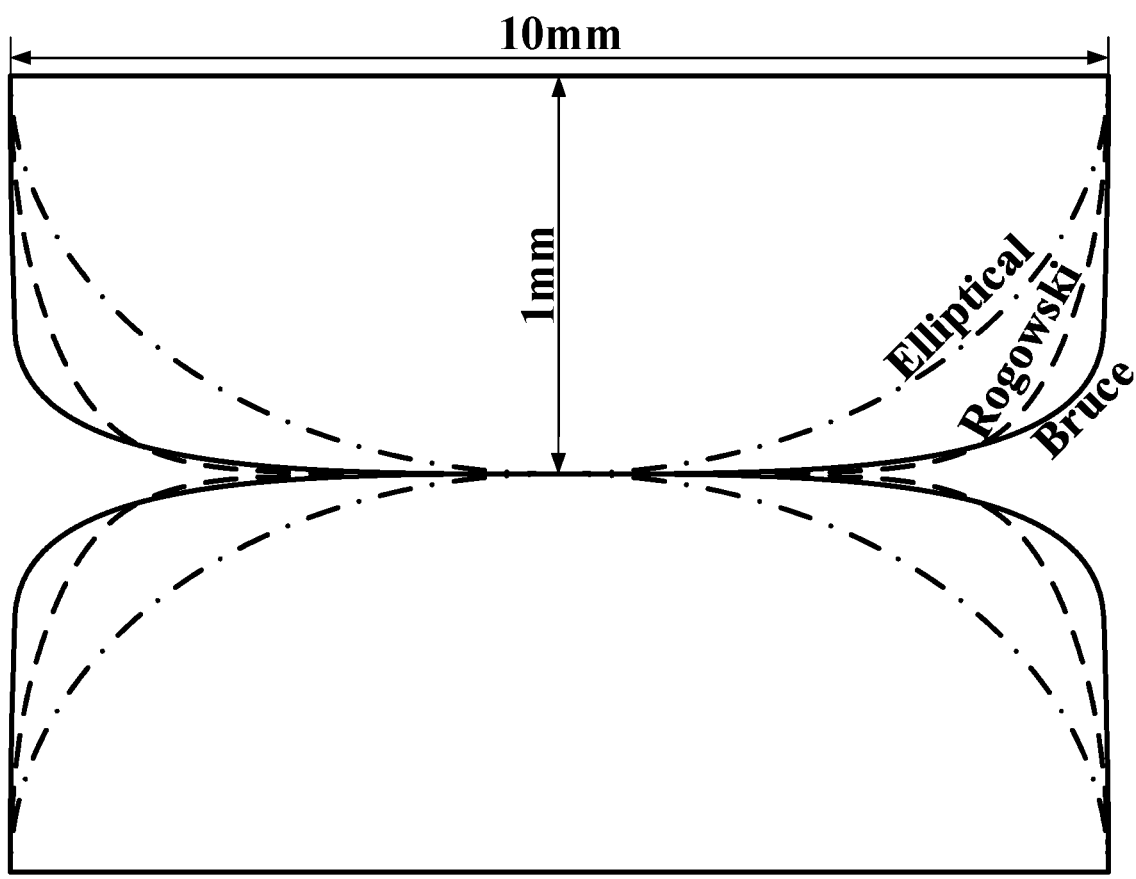
FIG. 5 illustrates a comparison of profiles of contacts having elliptical, Rogowski, and Bruce shape according to the present invention.

Using Equation 19 and Equation 20, $\alpha$ and $\phi$ can be derived. For the purposes of the simulation, Rogowski contacts have a height of 1 mm and a radius of 5 mm when $\phi=-549.5$, and Bruce contacts have a height of 1 mm and a radius of 5 mm when $\alpha=12.95°$ or $82.48°$. The curvatures of the contacts for designed height and radius is shown in FIG. 5.

The resistances of each contact geometry are simulated using an FEM model by setting the contacts in touch. By setting one end as input terminal and the other end as ground terminal, the resistance is simulated.

When contacts are in touch, ideally contacts touch in a single point. However, in practical cases, due to the slightly elastic nature of contact materials and the high contact pressure, multiple points or surface areas on the contacts touch. The touching area of the contacts is set to be 0.01 mm$^2$. Simulated resistances are calculated to be 146.825 µΩ for contacts having a spherical shape, 142.679 µΩ for contacts having an elliptical shape, 137.422 µΩ for contacts having a Rogowski shape, and 131.717 µΩ for contacts having a Bruce shape. The simulated resistance of spherical contacts is the highest at 146.825 µΩ, followed by elliptical contacts at 142.679 µΩ, then Rogowski contacts at 137.422 µΩ, and Bruce contacts have the lowest simulated resistance at 131.717 µΩ. Bruce contacts as simulated have 10% smaller contact resistance than the spherical contacts.

Simulations were subsequently performed with pairs of contacts having dimensions as outlined above with various sized touching areas. Generally, pairs of contacts having a spherical shape were simulated to have the highest resistance, followed by elliptical contacts, then Rogowski or Bruce.

Generally, it is expected that pairs contacts having smaller height profiles and larger touching areas would have smaller resistance. Although geometries were compared in simulation with identical touching areas, in practical applications, touching area would be expected to be increased with increased force applied between two contacts, use of higher elasticity contact materials, and for geometries having a flatter profile. Materials used for making the contacts, surface roughness of the contacts, surface treatment of the contacts (heat treatment vs cold treatment), and manufacturing processes of the material can also affect contact resistance. Therefore, contacts can be optimized for contact resistance considering these factors.

As will be appreciated and understood by one of ordinary skill in the art, contact geometries can be analyzed by various known means to determine electric field profiles between open contacts, breakdown voltage between open contacts, and/or contact resistance between closed contacts. For example, dielectric breakdown tests can be conducted between open contacts. For hybrid circuit breaker applications, it can be advantageous to perform dielectric breakdown tests in a vacuum. As another example, contact resistance can be measured between closed contacts over a range of contact forces. As another example, temperature rise can be measured due to current conduction between closed contacts over a range of contact forces.

As illustrated, electrical contact geometry can be optimized to achieve reduced peak electric fields between open contacts, reduced contact resistance between closed contacts, and reduced contact mass for faster transition between open and closed states. Using contacts having a spherical shape as a baseline, simulations show that elliptical, Rogowski, and Bruce shapes can be optimized for shaping electrical contacts according to desired design considerations. Contacts having optimized elliptical, Rogowski, or Bruce shapes can be advantageous for switchgear applications requiring sub-millimeter separation in the open state, for example, applications with limited contact travel such as piezoelectrically actuated disconnect switches. Elliptical, Rogowski, Bruce, and other shapes can be tailored to have a significantly reduced height compared to spherical contacts, which results in a reduction of bulk contact resistance and mass. Accordingly, contacts having geometries disclosed herein can be applied to circuit breaker disconnect switches, vacuum interrupters, sectionalizers, grounding switches, transfer switches, etc. where fast operation, restricted contact separation, and/or limiting fault current are desired.

In some embodiments, disclosed electrical contacts can be utilized for UFDSs. Hybrid circuit breakers, which incorporate both semiconductor switches and UFDSs, are proposed as protection devices to clear faults in medium voltage distribution systems. An example hybrid circuit breaker is disclosed in World Intellectual Property Organization International Publication Number WO 2015/112796 A1. Compared to their conventional counterparts, hybrid circuit breakers can have the ability to limit fault current due to the ability of the UFDS to transition from closed to open positions more quickly than conventional electromechanical switches used in the same application.

It is expected that hybrid circuit breakers could allow more interconnections between substations, provide advantages with respect to grid reliability and resiliency, enable the integration of distributed generation such as small solar power installations without expensive changes to the grid infrastructure, protect power distribution systems of micro grids, protect shipboard power systems of all-electric ships, and could limit ever increasing fault current levels in distribution systems in densely populated cities.

During the development of hybrid circuit breakers, much of the work has focused on different semiconductor-based power electronic circuits, and work on the details of the UFDS is rather limited and focuses on two variants: the Thompson coil principle and piezoelectric actuators. It is an object of the present invention to improve the functionality of an UFDS through optimized contact geometries.

In some embodiments, a hybrid circuit breaker design includes an UFDS that can withstand 15 kV when the contacts of the UFDS are in the open position and can conduct 600 A when the contacts of the UFDS are in the closed position. The contacts of the UFDS can withstand 15 kV when separated by about 0.5 mm in the open position. The hybrid circuit breaker can have a constant current rating of 600 A and an open circuit voltage rating of 15 kV.

In some embodiments, a hybrid circuit breaker can include an UFDS having contacts with geometries optimized for reduced electric field, reduced contact resistance, and/or low mass can and can include a drive mechanism integrated into a switching chamber. The drive mechanism can be an electromechanical actuator having an ultrafast response time. The actuator, once integrated inside the switching chamber can apply force directly to separate the contacts, creating a compact ultrafast disconnect switch. It is contemplated herein that the drive mechanism can be a piezoelectric actuator, magnetostrictive actuator, or other drive mechanisms known to one of ordinary skill in the art.

Figure 6A:
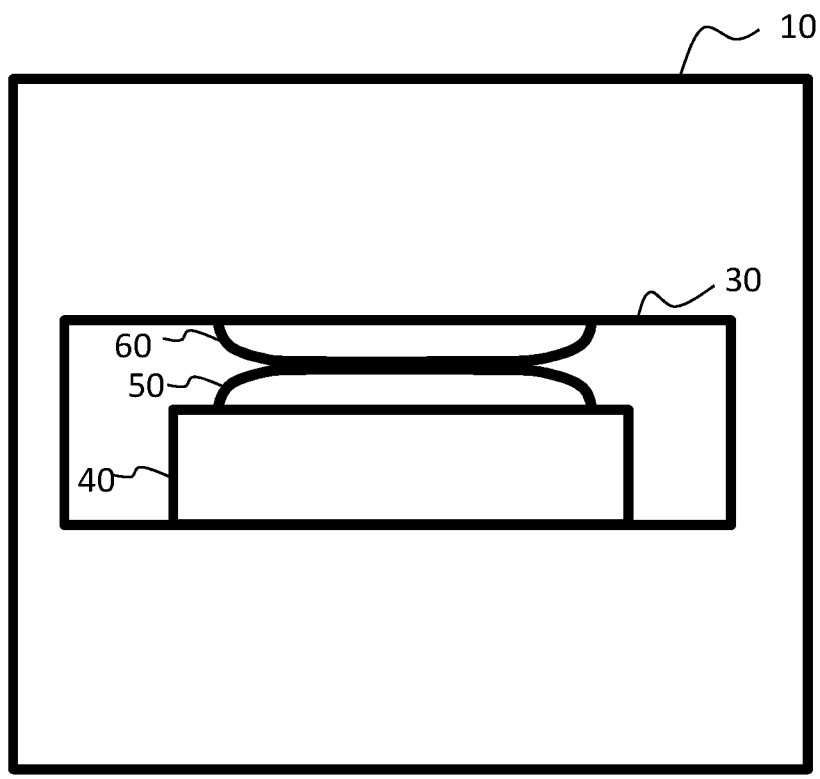
FIGS. 6A and 6B illustrate a hybrid circuit breaker according to the present invention.
Figure 6B:
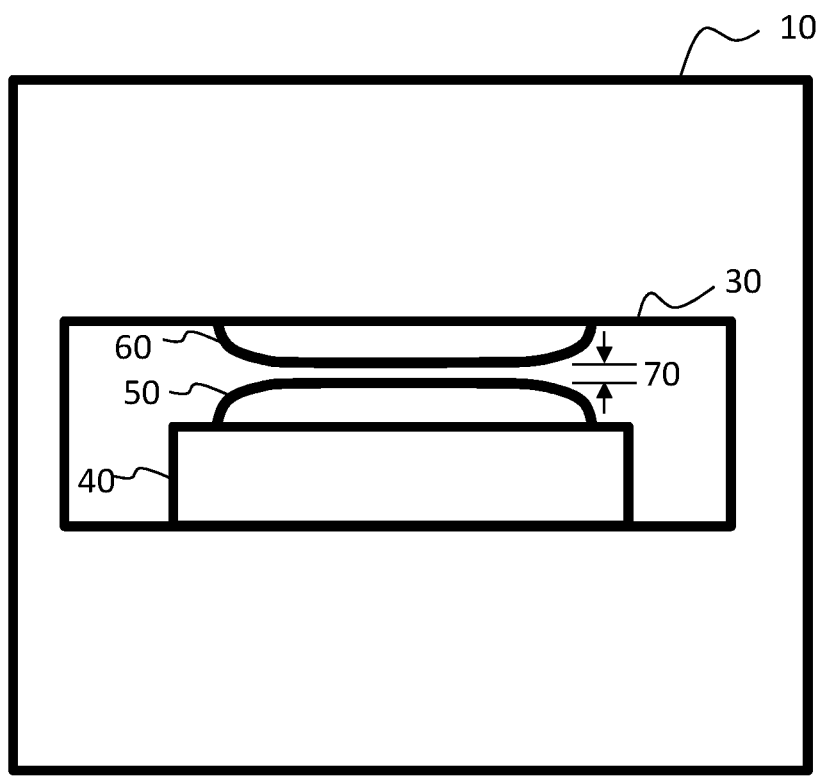

As illustrated in FIGS. 6A and 6B, a hybrid circuit breaker 10 can include an UFDS 30 comprising a first contact 50 and a second contact 60. The first contact 50 can be connected to an actuator 40, and the second contact 60 can be fixed. As shown in FIG. 6A, the first and second contacts 50, 60 can be in a closed position. As shown in FIG. 6B, the actuator can cause the first contact 50 to move away from the second contact 60 creating a gap 70 between the first and second contacts 50, 60, thereby positioning the contacts in the open position.

In some embodiments, a hybrid circuit breaker can include an UFDS that is designed to operate in a vacuum, carry continuous current similar to conventional vacuum interrupters, open at current zero, have minimum moving mass, and have a small open contact separation. A potential advantage of sub millisecond switching time of UFDS often comes at the cost of limited contact separation between open contacts, often in the order of less than a millimeter when a piezoelectric actuator is used. The resulting high electric field can introduce a risk of electrical breakdown between the open contacts. A limited separation distance can be achieved by optimizing contact geometry according to aspects of the present invention to keep the electric field within safe limits, minimize the moving mass, and reduce contact resistance. In some embodiments, optimized contact geometry can result in contacts having reduced mass by 50% and reduced contact resistance of 10% compared to spherical-shaped contacts previously studied for use in hybrid circuit breaker designs.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the Abstract is neither intended to define the claims of the application, nor is it intended to be limiting to the scope of the claims in any way. Instead, it is intended that the disclosed technology is defined by the claims appended hereto.

The invention claimed is:

1. A method comprising:
selecting a geometrical shape comprising:
a perimeter; and
a surface defined at least in part by a variable; and
selecting a value for the variable based at least in part on an electric field between a first electrical contact and a second electrical contact, each in an open position.

2. A method comprising switching a pair of electrical contacts in an electric field between one of an open position and a closed position to the other of the open position and the closed position;
wherein each contact of the pair of electrical contacts comprises a contact surface having a geometrical shape determined by the method of claim 1;
wherein the contact surfaces of the pair of electrical contacts are positioned opposite each other such that in the open position the contact surfaces of the pair of electrical contacts are separated by a gap, and in the closed position the contact surfaces of the pair of electrical contacts are in contact; and
wherein the contact surfaces of the pair of electrical contacts are symmetric with respect to each other about a plane between the electrical contacts.

3. The method of claim 1, wherein the perimeter is circular; and
wherein the surface is radially symmetrical and has a profile defined by a radius of the perimeter and the variable.

4. The method of claim 3, wherein the profile is a uniform field profile.

5. The method of claim 3, wherein the profile is selected from the group consisting of a Rogowski profile and a Bruce profile.

6. The method of claim 3, wherein the profile is an elliptical profile and the variable is a height of the elliptical profile.

7. The method of claim 3, wherein the radius measures between about 2 mm and about 10 mm.

8. The method of claim 3, wherein the profile is a Rogowski profile and the variable is a line force variable $\phi$.

9. The method of claim 8, wherein the radius measures between about 2 mm and about 10 mm; and
wherein the value of the line force variable $\phi$ is between about −600 and about −480.

10. The method of claim 3, wherein the profile is a Bruce profile comprising a sinusoidal section and the variable is a characteristic angle $\alpha$ of the sinusoidal section.

11. The method of claim 10, wherein the radius measures between about 2 mm and about 10 mm; and
wherein the value of the characteristic angle $\alpha$ is between about 400 and about 70°.

12. The method of claim 1 further comprising:
selecting a value for each of at least one additional variable based at least in part on the electric field;
wherein the surface is defined by the variable and each of the at least one additional variable;
wherein each electrical contact comprises a contact surface having the geometrical shape;
wherein the electrical contacts are electrical contacts of an electromechanical switch;
wherein the contact surfaces are positioned opposite each other; and
wherein the contact surfaces are symmetric with respect to each other about a plane between the electrical contacts.

13. The method of claim 12 further comprising selecting each value of the variables to minimize a peak of the electric field.

14. The method of claim 12, wherein selecting each value of the variables is further based at least in part on a contact resistance between the electrical contacts in a closed position.

15. The method of claim 12, wherein selecting each value for variables is further based at least in part on a mass of at least one of the electrical contacts.

16. The method of claim 12, wherein the contact surfaces are separated by a gap measuring about 0.5 mm when the electrical contacts are in the open position.

17. The method of claim 12 further comprising:
moving the electrical contacts from the open position to a closed position in response to a contact force of approximately 100 N.

18. The method of claim 12, wherein the electric field results from an electrostatic potential of about 15 kV between the electrical contacts in the open position.

19. The method of claim 12, wherein the electrical contacts are configured to conduct about 600 A when the electrical contacts are in a closed position.

20. The method of claim 12 further comprising:
providing the electrical contacts; and
positioning the electrical contacts within the electromechanical switch such that the electrical contacts are movable from a closed position to the open position.

* * * * *